(12) United States Patent
Landers, Jr. et al.

(10) Patent No.: US 8,725,458 B2
(45) Date of Patent: May 13, 2014

(54) HEAT SINK BLOCKAGE DETECTOR

(75) Inventors: John David Landers, Jr., Raleigh, NC (US); David John Steiner, Raleigh, NC (US); Paul Morton Wilson, Cary, NC (US); Kimberly Ann Wood, Raleigh, NC (US)

(73) Assignee: International Business Machines Corporation, Armonk, NY (US)

( * ) Notice: Subject to any disclaimer, the term of this patent is extended or adjusted under 35 U.S.C. 154(b) by 1039 days.

(21) Appl. No.: 12/346,103

(22) Filed: Dec. 30, 2008

(65) Prior Publication Data
US 2010/0169046 A1 Jul. 1, 2010

(51) Int. Cl.
*G21C 17/00* (2006.01)
*H01L 23/34* (2006.01)

(52) U.S. Cl.
USPC ............................ 702/182; 257/717; 257/722

(58) Field of Classification Search
USPC .................................. 702/182; 257/717, 722
See application file for complete search history.

(56) References Cited

U.S. PATENT DOCUMENTS

| | | | |
|---|---|---|---|
| 4,080,069 A * | 3/1978 | Pollina | ............................ 355/74 |
| 4,401,189 A | 8/1983 | Majewski | |
| 4,629,052 A | 12/1986 | Kitamura | |
| 4,800,998 A | 1/1989 | Myrick | |
| 6,496,273 B1 | 12/2002 | Stimpson et al. | |
| 7,058,272 B2 * | 6/2006 | Bourdelais et al. | ........... 385/129 |
| 7,088,477 B2 * | 8/2006 | Koshimizu et al. | ........... 358/487 |
| 7,262,704 B2 * | 8/2007 | Shetty et al. | ................... 340/627 |
| 7,312,433 B2 | 12/2007 | Stimpson et al. | |
| 7,891,410 B1 * | 2/2011 | Monson et al. | ............... 165/80.2 |
| 8,270,839 B2 * | 9/2012 | Marien | .......................... 398/135 |
| 2003/0154002 A1 * | 8/2003 | Lappen et al. | ................. 700/218 |
| 2008/0246624 A1 * | 10/2008 | Ye et al. | ........................ 340/679 |

FOREIGN PATENT DOCUMENTS

| | | |
|---|---|---|
| CN | 1375720 A | 10/2002 |
| CN | 101282631 A | 10/2008 |
| JP | 2102434 | 4/1990 |
| JP | 08162787 A | 6/1996 |

OTHER PUBLICATIONS

PCT Search report for application PCT/EP2009/064600 dated Apr. 15, 2010.

\* cited by examiner

*Primary Examiner* — Michael Nghiem
*Assistant Examiner* — Alexander Satanovsky
(74) *Attorney, Agent, or Firm* — Yee & Associates, P.C.; Thomas E. Tyson

(57) ABSTRACT

A method, a data processing system, and a computer program product identify blockages in a heat sink of a data processing system. An electromagnetic emitter and an electromagnetic detector are positioned on opposite sides of the heat sink. An intensity of a stream of electromagnetic radiation directed from the electromagnetic emitter is measured by the electromagnetic detector. Based on the measured intensity of the stream of electromagnetic radiation as measured by the electromagnetic detector, a blockage level of the heat sink is determined. If the blockage level of the heat sink exceeds a blockage threshold, an alert is generated.

11 Claims, 4 Drawing Sheets

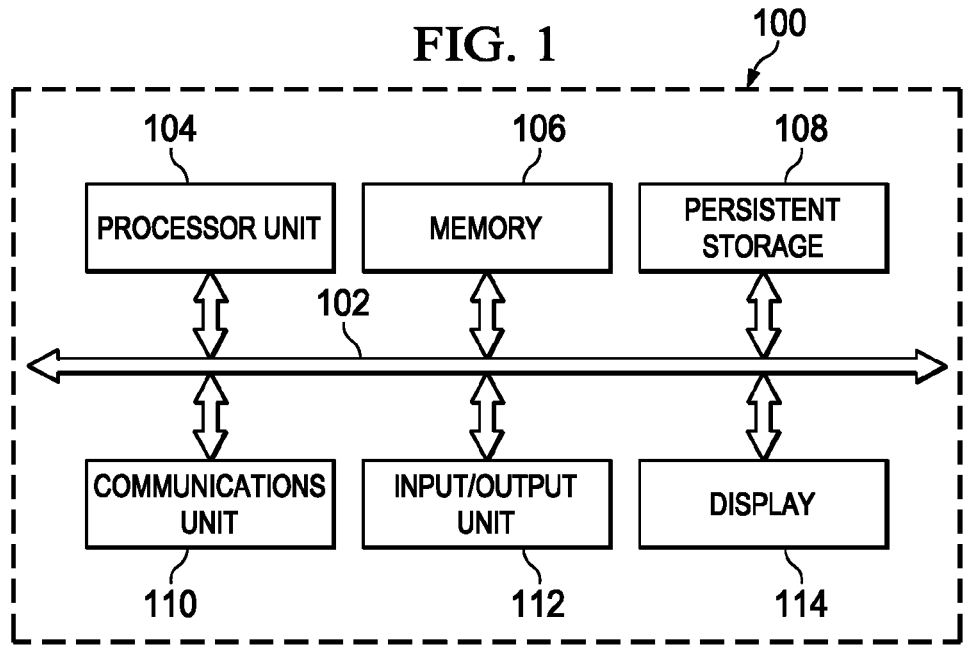
FIG. 1
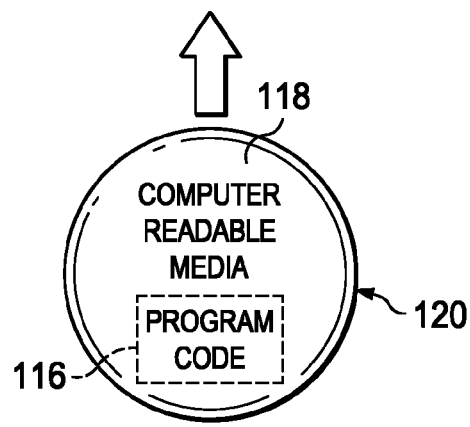
FIG. 2

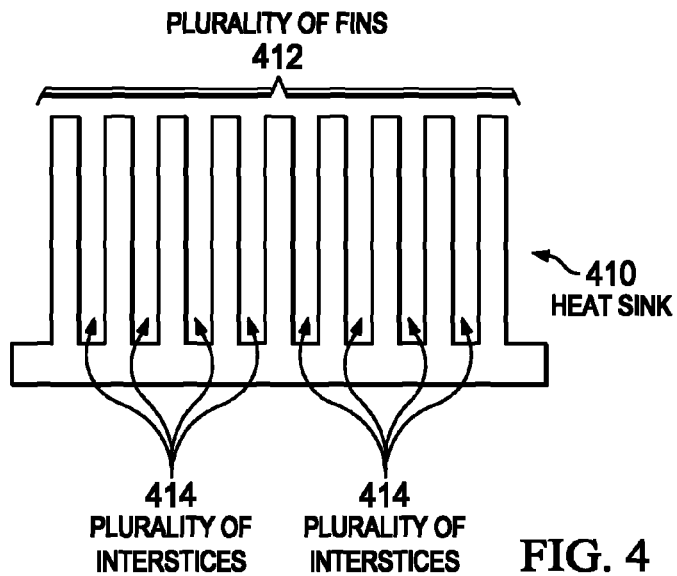
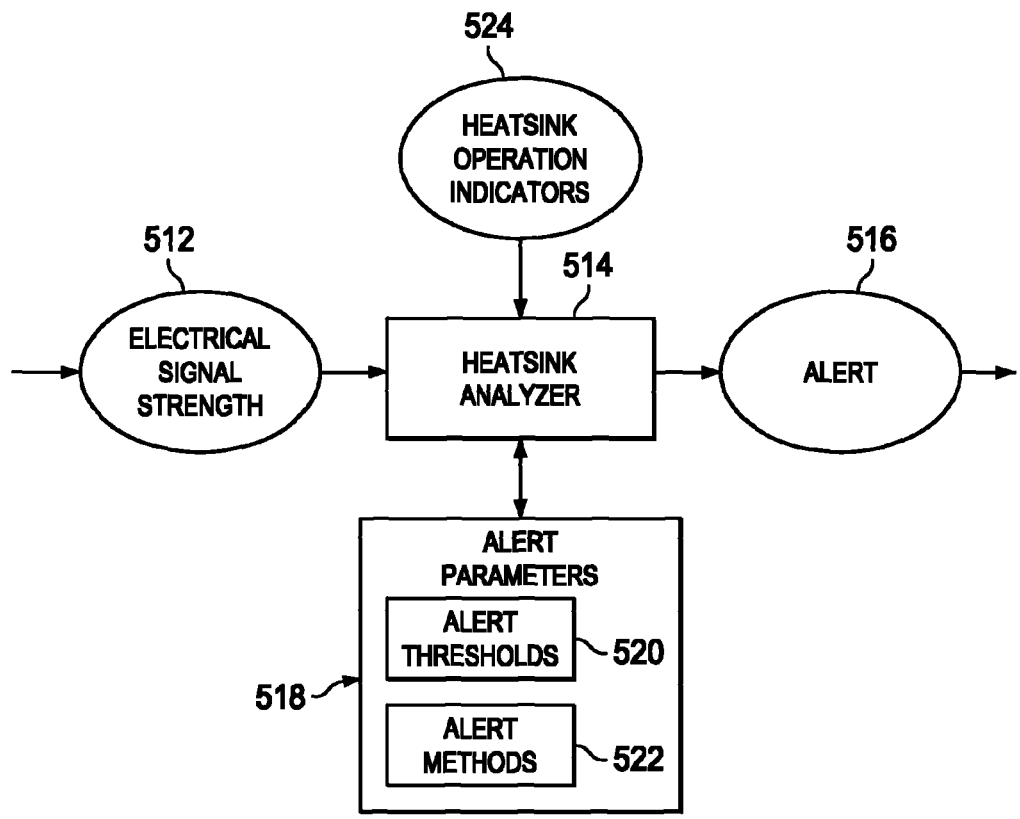

HEAT SINK BLOCKAGE DETECTOR

BACKGROUND OF THE INVENTION

1. Field of the Invention

The present invention relates generally to a computer implemented method, a data processing system, and an electromagnetic detection system. More specifically, the present invention relates to a method, a data processing system, and an electromagnetic detection system for identifying debris build up within the heat sink of an integrated circuit of the data processing system.

2. Description of the Related Art

In order to deliver powerful computing resources, computer architects must design powerful computer processors and high-speed memory modules. Current computer processors, for example, are capable of executing billions of computer program instructions per second. Operating these computer processors and memory modules requires a significant amount of power. Often processors can consume over 100 watts during operation. Consuming significant amounts of power generates a considerable amount of heat. Unless the heat is removed, the heat generated by a computer processor or memory module may degrade or destroy the component's functionality.

To prevent the degradation or destruction of an electronic component, a computer architect may remove heat from the electronic component by using traditional heat sinks. Traditional heat sinks typically have fins for dissipating heat into the environment surrounding the heat sink. Traditional heat sinks absorb the heat from an electronic component and transfer the heat throughout the heat-dissipating fins using thermal conduction.

Many of these cooling solutions require forced air by a fan or blower in order to move a high quantity of air to maximize the cooling effectiveness. In some industrial or commercial environments, there have been issues associated with heat sinks clogging up with dirt, dust and lint that is carried into the system by the fan.

BRIEF SUMMARY OF THE INVENTION

According to one embodiment of the present invention, a method, a data processing system, and a computer program product identify blockages in a heat sink. An electromagnetic emitter and an electromagnetic detector are positioned on opposite sides of the heat sink. An intensity of a stream of electromagnetic radiation directed from the electromagnetic emitter is measured by the electromagnetic detector. Based on the measured intensity of the stream of electromagnetic radiation as measured by the electromagnetic detector, a blockage level of the heat sink is determined. If the blockage level of the heat sink exceeds a blockage threshold, an alert is generated.

BRIEF DESCRIPTION OF THE SEVERAL VIEWS OF THE DRAWINGS

FIG. 1 is a diagram of a data processing system in accordance with an illustrative embodiment;

FIG. 2 is a single fin of a heat sink according to an illustrative embodiment;

FIG. 4 is an axial heat sink blockage detection system for an integrated circuit according to an illustrative embodiment FIG. 5 is a dataflow diagram of heat sink blockage monitoring according to an illustrative embodiment.

DETAILED DESCRIPTION OF THE INVENTION

Figure 3:
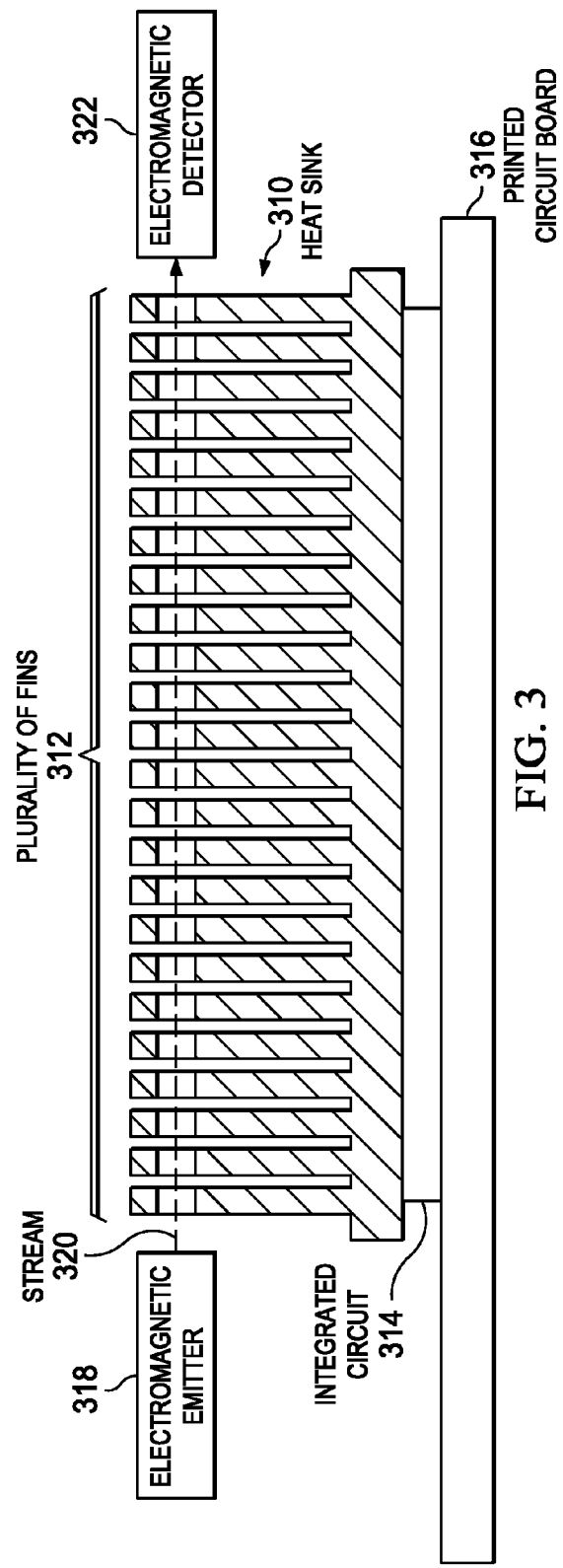
FIG. 3 is a transverse heat sink blockage detection system for an integrated circuit according to an illustrative embodiment.

As will be appreciated by one skilled in the art, the present invention may be embodied as a system, method, or computer program product. Accordingly, the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, the present invention may take the form of a computer program product embodied in any tangible medium of expression having computer usable program code embodied in the medium.

Any combination of one or more computer usable or computer readable medium(s) may be utilized. The computer-usable or computer-readable medium may be, for example but not limited to, an electronic, magnetic, optical, electromagnetic, infrared, or semiconductor system, apparatus, device, or propagation medium. More specific examples (a non-exhaustive list) of the computer-readable medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CDROM), an optical storage device, a transmission media such as those supporting the Internet or an intranet, or a magnetic storage device. Note that the computer-usable or computer-readable medium could even be paper or another suitable medium upon which the program is printed, as the program can be electronically captured, via, for instance, optical scanning of the paper or other medium, then compiled, interpreted, or otherwise processed in a suitable manner, if necessary, and then stored in a computer memory. In the context of this document, a computer-usable or computer-readable medium may be any medium that can contain, store, communicate, propagate, or transport the program for use by or in connection with the instruction execution system, apparatus, or device. The computer-usable medium may include a propagated data signal with the computer-usable program code embodied therewith, either in baseband or as part of a carrier wave. The computer usable program code may be transmitted using any appropriate medium, including, but not limited to wireless, wireline, optical fiber cable, RF, etc.

Computer program code for carrying out operations of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

The present invention is described below with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer program instructions.

These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer program instructions may also be stored in a computer-readable medium that can direct a computer or other programmable data processing apparatus to function in a particular manner, such that the instructions stored in the computer-readable medium produce an article of manufacture including instruction means which implement the function/act specified in the flowchart and/or block diagram block or blocks.

The computer program instructions may also be loaded onto a computer or other programmable data processing apparatus to cause a series of operational steps to be performed on the computer or other programmable apparatus to produce a computer implemented process such that the instructions which execute on the computer or other programmable apparatus provide processes for implementing the functions/acts specified in the flowchart and/or block diagram block or blocks.

Turning now to FIG. 1, a diagram of a data processing system is depicted in accordance with an illustrative embodiment. In this illustrative example, data processing system 100 includes communications fabric 102, which provides communications between processor unit 104, memory 106, persistent storage 108, communications unit 110, input/output (I/O) unit 112, and display 114.

Processor unit 104 serves to execute instructions for software that may be loaded into memory 106. Processor unit 104 may be a set of one or more processors or may be a multi-processor core, depending on the particular implementation. Further, processor unit 104 may be implemented using one or more heterogeneous processor systems in which a main processor is present with secondary processors on a single chip. As another illustrative example, processor unit 104 may be a symmetric multi-processor system containing multiple processors of the same type.

Memory 106 and persistent storage 108 are examples of storage devices. A storage device is any piece of hardware that is capable of storing information either on a temporary basis and/or a permanent basis. Memory 106, in these examples, may be, for example, a random access memory or any other suitable volatile or non-volatile storage device. Persistent storage 108 may take various forms depending on the particular implementation. For example, persistent storage 108 may contain one or more components or devices. For example, persistent storage 108 may be a hard drive, a flash memory, a rewritable optical disk, a rewritable magnetic tape, or some combination of the above. The media used by persistent storage 108 also may be removable. For example, a removable hard drive may be used for persistent storage 108.

Communications unit 110, in these examples, provides for communications with other data processing systems or devices. In these examples, communications unit 110 is a network interface card. Communications unit 110 may provide communications through the use of either or both physical and wireless communications links.

Input/output unit 112 allows for input and output of data with other devices that may be connected to data processing system 100. For example, input/output unit 112 may provide a connection for user input through a keyboard and mouse. Further, input/output unit 112 may send output to a printer. Display 114 provides a mechanism to display information to a user.

Instructions for the operating system and applications or programs are located on persistent storage 108. These instructions may be loaded into memory 106 for execution by processor unit 104. The processes of the different embodiments may be performed by processor unit 104 using computer implemented instructions, which may be located in a memory, such as memory 106. These instructions are referred to as program code, computer usable program code, or computer readable program code that may be read and executed by a processor in processor unit 104. The program code in the different embodiments may be embodied on different physical or tangible computer readable media, such as memory 106 or persistent storage 108.

Program code 116 is located in a functional form on computer readable media 118 that is selectively removable and may be loaded onto or transferred to data processing system 100 for execution by processor unit 104. Program code 116 and computer readable media 118 form computer program product 120 in these examples. In one example, computer readable media 118 may be in a tangible form, such as, for example, an optical or magnetic disc that is inserted or placed into a drive or other device that is part of persistent storage 108 for transfer onto a storage device, such as a hard drive that is part of persistent storage 108. In a tangible form, computer readable media 118 also may take the form of a persistent storage, such as a hard drive, a thumb drive, or a flash memory that is connected to data processing system 100. The tangible form of computer readable media 118 is also referred to as computer recordable storage media. In some instances, computer readable media 118 may not be removable.

Alternatively, program code 116 may be transferred to data processing system 100 from computer readable media 118 through a communications link to communications unit 110 and/or through a connection to input/output unit 112. The communications link and/or the connection may be physical or wireless in the illustrative examples. The computer readable media also may take the form of non-tangible media, such as communications links or wireless transmissions containing the program code.

In some illustrative embodiments, program code 116 may be downloaded over a network to persistent storage 108 from another device or data processing system for use within data processing system 100. For instance, program code stored in a computer readable storage medium in a server data processing system may be downloaded over a network from the server to data processing system 100. The data processing system providing program code 116 may be a server computer, a client computer, or some other device capable of storing and transmitting program code 116.

The different components illustrated for data processing system 100 are not meant to provide architectural limitations to the manner in which different embodiments may be implemented. The different illustrative embodiments may be implemented in a data processing system including components in addition to or in place of those illustrated for data processing system 100. Other components shown in FIG. 1 can be varied from the illustrative examples shown. The different embodiments may be implemented using any hardware device or system capable of executing program code. As one example, the data processing system may include organic components integrated with inorganic components and/or may be comprised entirely of organic components excluding a human being. For example, a storage device may be comprised of an organic semiconductor.

As another example, a storage device in data processing system 100 is any hardware apparatus that may store data. Memory 106, persistent storage 108 and computer readable media 118 are examples of storage devices in a tangible form.

In another example, a bus system may be used to implement communications fabric 102 and may be comprised of one or more buses, such as a system bus or an input/output bus. Of course, the bus system may be implemented using any suitable type of architecture that provides for a transfer of data between different components or devices attached to the bus system. Additionally, a communications unit may include one or more devices used to transmit and receive data, such as a modem or a network adapter. Further, a memory may be, for example, memory 106 or a cache such as found in an interface and memory controller hub that may be present in communications fabric 102.

The illustrative embodiments provide a method, a data processing system, and a computer program product to identify blockages in a heat sink. An electromagnetic emitter and an electromagnetic detector are positioned on opposite sides of the heat sink. An intensity of a stream of electromagnetic radiation directed from the electromagnetic emitter is measured by the electromagnetic detector. Based on the measured intensity of the stream of electromagnetic radiation as measured by the electromagnetic detector, a blockage level of the heat sink is determined. If the blockage level of the heat sink exceeds a blockage threshold, an alert is generated.

It is appreciated the heat sink blockage detection system described in the illustrative embodiments can be employed in any environment where a heatsink may be useful. While the illustrative embodiments describe the heat sink blockage detection system for use with an integrated circuit, the heat sink blockage detection system can also be utilized in applications such as, for example, but not limited to, refrigeration, heat engines, electronic devices, mechanical devices, and lasers.

Referring now to FIG. 2, a single fin of a heat sink is shown according to an illustrative embodiment. Fin 200 is one of a plurality of heat-dissipating fins that typically comprise a heat sink. Fin 200 is a thermal conductor that provides additional surface area to a heat sink for dissipating the thermal load.

Fin 200 comprises fin body 210 and aperture 212. Fin body 210 can be made of for example, but not limited to, an aluminum alloy, or other material capable of dissipating heat generated by an attached integrated circuit.

Aperture 212 is a fabricated or machined opening traversing through to either side of fin body 210. Aperture 212 provides a pathway through which a directed beam of electromagnetic radiation can pass.

Referring now to FIG. 3, a transverse heat sink blockage detection system for an integrated circuit is shown according to an illustrative embodiment. Heat sink 310 can be attached to an integrated circuit, such as processor unit 104 of FIG. 1. Heat sink 310 is comprised of plurality of fins 312. Each one of plurality of fins 310 can be fin 200 of FIG. 2.

Heat sink 310 is component designed to lower the temperature of an electronic device by dissipating heat into the surrounding air. Heat sink 310 can be an active heat sink, or a passive heat sink. Heat sink 310 can be made of for example, but not limited to, an aluminum alloy. Heat sink 310 comprises plurality of fins 312. Plurality of fins 312 are arranged so that their respective apertures align in a collinear manner.

Heat sink 310 sits atop integrated circuit 314. Integrated circuit 314, sometimes called a chip or microchip, is a semiconductor wafer on which thousands or millions of tiny resistors, capacitors, and transistors are fabricated. Integrated circuit 314 can be, for example, but not limited to, an amplifier, an oscillator, a timer, a counter, a computer memory, or a microprocessor. Heat sink 310 helps to dissipate heat generated by integrated circuit 314.

Integrated circuit 314 can be mounted onto printed circuit board 316. Printed circuit board 316 is a thin plate on which chips and other electronic components are placed. Data processing systems consist of one or more boards, often called cards or adapters. Printed circuit board 316 can be, for example, but not limited to, a motherboard, an expansion board, a network interface card, and a video adapter.

During operation of a data processing system, dust, lint, dirt and other debris will routinely adhere to heat sink 310. This debris can impede air flow around the heat sink 310, negatively impacting cooling of integrated circuit 314. Overheating of the integrated circuit 314 can in turn negatively impact performance of the data processing system.

Electromagnetic emitter 318 is aligned with the collinear apertures of plurality of fins 312. Electromagnetic emitter 318 can be any source of electromagnetic radiation, including visible, infrared, and ultraviolet. Electromagnetic emitter 318 can be, for example, a light bulb, a heating element, a light emitting diode, or a laser. In one illustrative embodiment, electromagnetic emitter 318 is a semiconductor fabricated laser, such as a vertical-cavity surface-emitting laser (VSCEL), a vertical external-cavity surface-emitting lasers (VECSEL), or an edge emitting diode. Electromagnetic emitter 318 directs a stream 320 of electromagnetic radiation through the apertures of plurality of fins 312, to electromagnetic detector 322.

Electromagnetic detector 322 is a transducer that converts an electromagnetic signal into an electrical signal. When Electromagnetic detector 322 receives stream 320, electromagnetic detector generates an electrical current proportional to the intensity of incident electromagnetic radiation.

Electromagnetic emitter 318 emits stream 320 at a consistent intensity. As dust, lint, dirt and other debris adhere to heat sink 310, the dust, lint, dirt and other debris clogs the apertures of plurality of fins 312, obscuring stream 320. As more deposits of the dust, lint, dirt and other debris accumulate within the collinear apertures of plurality of fins 312, stream 320 becomes scattered, blocked, or diffracted by the accumulations. The measured intensity of stream 320, as detected by electromagnetic detector 322, therefore decreases.

Referring now to FIG. 4, an axial heat sink blockage detection system for an integrated circuit is shown according to an illustrative embodiment. Heat sink 410 can be attached to an integrated circuit, such as processor unit 104 of FIG. 1. Heat sink 410 is comprised of plurality of fins 412. Each one of plurality of fins 412 can be fin 200 of FIG. 2.

Heat sink 410 is component designed to lower the temperature of an electronic device by dissipating heat into the surrounding air. Heat sink 410 can be an active heat sink, or a passive heat sink. Heat sink 410 can be made of for example, but not limited to, an aluminum alloy. Heat sink 410 comprises plurality of fins 412. Heat sink 410 can be a heat sink such as heat sink 310 of FIG. 3.

Plurality of interstices 414 intervene between plurality of fins 412. Plurality of interstices 414 allow for air to flow between and around plurality of fins 412, increasing the effectiveness of the radiant cooling of the underlying integrated circuit, such as integrated circuit 314 of FIG. 3.

An electromagnetic emitter, such as electromagnetic emitter 318 of FIG. 3, is linearly aligned with an electromagnetic detector, such as electromagnetic detector 322 of FIG. 3. The electromagnetic emitter and the electromagnetic detector are aligned such that a stream traverses through at least one of plurality of interstices 414. The stream is electromagnetic radiation emitted by an electromagnetic emitter. The stream can be a stream such as stream 320 of FIG. 3.

As more deposits of the dust, lint, dirt and other debris accumulate within the plurality of interstices 414, the stream becomes scattered, blocked, or diffracted by the accumulations. The measured intensity of stream 320, as detected by an electromagnetic detector 322, therefore decreases.

Referring now to FIG. 5, a dataflow diagram of heat sink blockage monitoring is shown according to an illustrative embodiment. Heat sink blockage monitoring system 500 can be used to monitor debris blockage in a heat sink, such as heat sink 310 of FIG. 3.

Electrical signal strength 512 is determined from the output from an electromagnetic detector, such as electromagnetic detector 322 of FIG. 3. Electrical signal strength is a measure of the electrical current output from an electromagnetic detector. The electrical current output from an electromagnetic detector is proportional to the intensity of incident electromagnetic radiation, such as stream 320 of FIG. 3.

Electrical signal strength 512 is input into heat sink analyzer 514. Heat sink analyzer 514 is a software, hardware or firmware component that tracks the operational inputs, including, for example, but not limited to, ambient temperature and electrical signal strength 512. Heat sink analyzer 514 can relate electrical signal strength 512 to a degree of blockage of the heat sink. Heat sink analyzer 514 can also generate alerts 516 if the degree of blockage of the heat sink violates alert parameters 518. Heat sink analyzer 514 can also correlate heat sink blockage to ambient temperature and temperature of the heat sink to identify true blockage conditions.

In one illustrative embodiment, heat sink analyzer 514 can also monitor a degradation of electrical signal strength 512 over a timed duration. The rate of degradation of electrical signal strength 512 correlates to a rate of debris accumulation within the heat sink. By knowing a rate of degradation of electrical signal strength 512 and the rate of debris accumulation within the heat sink, heat sink analyzer 514 can predict when electrical signal strength 512 will fall below acceptable levels, indicating blockage levels within the heat sink that exceed acceptable levels. Based on the rate of debris accumulation within the heat sink, heat sink analyzer 514 can make predictive recommendations as to when the heat sink should be cleaned.

In one illustrative embodiment, heat sink analyzer 514 can account for environmental conditions, such as for example, but not limited to, temperature, humidity, and air circulation. Environmental conditions influence the rate at which the heat sink dissipates heat energy into the surrounding environment. Blockage within the heat sink may therefore be more significant under certain adverse environmental conditions. By accounting for variable environmental conditions, heat sink analyzer 514 can optimize predictive recommendations and alert conditions to the environment in which the heat sink operates.

A user inputs alert parameters 518 into heat sink analyzer 514. Alert parameters 518 input by the user specify alert thresholds 520 and alert methods 522. Alert threshold 520 defines a level of acceptable blockage of the a heat sink, such as heat sink 310 of FIG. 3, based on the intensity of incident electromagnetic radiation received at an electromagnetic detector, such as electromagnetic detector 322 of FIG. 3. As more deposits of the dust, lint, dirt and other debris accumulate within the collinear apertures of the heat sink's fins, the measured intensity of incident electromagnetic radiation as detected by the electromagnetic detector decreases from a baseline amount. Alert thresholds 520 specifies the level of acceptable blockage of the a heat sink, based on the transmitted intensity of incident electromagnetic radiation as transmitted by the electromagnetic emitter, and the measured intensity of incident electromagnetic radiation, as measured by the electromagnetic detector.

Alert methods 522 indicate the user specified method by which the user should be informed in the event that the amount of blockage of the heat sink has exceeded the user defined acceptable levels. Alert method 522 can be any alert that notifies the user of the blockage, such as, but not limited to, an audible alarm, a visual alarm, an e-mail, a text short message system message, or other textual alert sent to the user.

A user inputs heat sink operation indicators 524 into heat sink analyzer 514. Heat sink operation indicators 524 can be for example, but not limited to, a selection of the transmitted wavelength for electromagnetic radiation, a selection of the intensity of the transmitted wavelength for electromagnetic radiation, a selection of the sensitivity of the electromagnetic detector. Heat sink operation indicators 524 can be adjusted to optimize detection of actual blockages of the heat sink while minimizing false detections due to minimal blockages of the heat sink's fin apertures.

In the event that blockage of the heat sink's fin apertures exceeds alert thresholds 520, heat sink analyzer 514 generates alert 516. Alert 516 is a notification, according to alert methods 522, to the user that the current blockage level exceeds acceptable limits as specified by alert thresholds 520. Alert 516 is delivered to the user according to alert methods 522 as indicated by the user. Alert 516 can therefore be, for example, but not limited to, an audible alarm, a visual alarm, an e-mail or other textual alert sent to the user.

In one illustrative embodiment, Heat sink blockage monitoring system 500 includes visualization meter 526. Visualization meter 526 graphical or mechanical gauge representing electrical signal strength 512 or a blockage levels within the heat sink relative to a maximum allowed blockage level. Visualization meter 526 can be a hardware or software gauge. A user can therefore quickly determine the relative blockage levels or transmittance levels by inspecting the graphical or mechanical gauge indicating alert 516.

Figure 6:
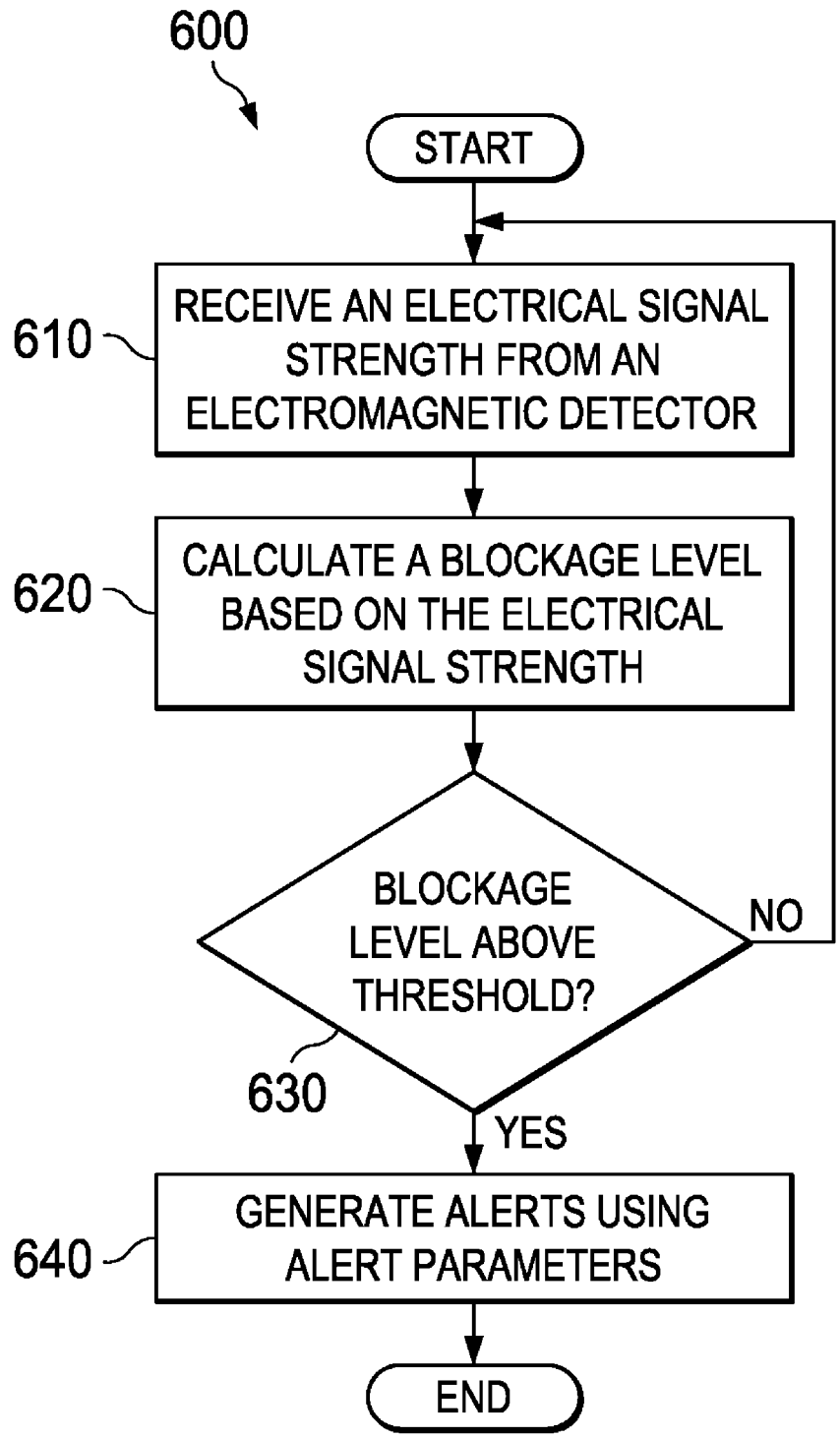
FIG. 6 is a flowchart for determining a heat sink blockage according to an illustrative embodiment.

Referring now to FIG. 6, a flowchart for determining a heat sink blockage is shown according to an illustrative embodiment. Process 600 is a software or firmware process, executing on a software or hardware component, such as heat sink analyzer 514 of FIG. 5.

Process 600 begins by receiving an electrical signal from an electromagnetic detector (step 610). The electrical signal is output from an electromagnetic detector, such as electromagnetic detector 322 of FIG. 3. The electrical signal is proportional to the intensity of incident electromagnetic radiation received by the electromagnetic detector.

Responsive to receiving an electrical signal from an electromagnetic detector, process 600 calculates a blockage level based on the signal strength (step 620). The electromagnetic emitter transmits electromagnetic radiation at a known, constant intensity. Therefore, a baseline intensity for the received stream is easily established. When the electromagnetic detector detects the transmitted electromagnetic radiation, deviation from that baseline is extrapolated to determine the amount of blockage within the collinear apertures of the heat sink's fins.

Responsive to calculating a blockage level based on the signal strength, process 600 whether the blockage level is above the blockage threshold (step 630). The blockage threshold can be alert threshold 520 of FIG. 5. As more deposits of dust, lint, dirt and other debris accumulate within the collinear apertures of the heat sink's fins, the measured intensity of incident electromagnetic radiation as detected by the electromagnetic detector decreases from a baseline amount. The blockage threshold specifies the level of acceptable blockage of the heat sink, based on the transmitted intensity of incident electromagnetic radiation as transmitted by the electromagnetic emitter, and the measured intensity of incident electromagnetic radiation, as measured by the electromagnetic detector.

Responsive to identifying that the blockage level is above the blockage threshold ("yes" at step 630), process 600 generates an alert using the alert parameters (step 640, with the process terminating thereafter. The alert parameters can be alert parameters 518 of FIG. 5. The alert is a notification, according to alert methods, such as alert methods 522 of FIG. 5, to the user that the alert thresholds have been exceeded. The alert can be delivered to the user according to the alert methods as indicated by the user. The alert can therefore be, for example, but not limited to, an audible alarm, a visual alarm, an e-mail or other textual alert sent to the user.

The illustrative embodiments described herein provide a method, a data processing system, and an electromagnetic detection system for identifying debris build up within the heat sink. An electromagnetic emitter and an electromagnetic detector are positioned on opposite sides of the heat sink. An intensity of a stream of electromagnetic radiation directed from the electromagnetic emitter is measured by the electromagnetic detector. Based on the measured intensity of the stream of electromagnetic radiation as measured by the electromagnetic detector, a blockage level of the heat sink is determined. If the blockage level of the heat sink exceeds a blockage threshold, an alert is generated.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

The invention can take the form of an entirely hardware embodiment, an entirely software embodiment or an embodiment containing both hardware and software elements. In a preferred embodiment, the invention is implemented in software, which includes but is not limited to firmware, resident software, microcode, etc.

Furthermore, the invention can take the form of a computer program product accessible from a computer-usable or computer-readable medium providing program code for use by or in connection with a computer or any instruction execution system. For the purposes of this description, a computer-usable or computer readable medium can be any tangible apparatus that can contain, store, communicate, propagate, or transport the program for use by or in connection with the instruction execution system, apparatus, or device.

The medium can be an electronic, magnetic, optical, electromagnetic, infrared, or semiconductor system (or apparatus or device) or a propagation medium. Examples of a computer-readable medium include a semiconductor or solid-state memory, magnetic tape, a removable computer diskette, a random access memory (RAM), a read-only memory (ROM), a rigid magnetic disk and an optical disk. Current examples of optical disks include compact disk-read only memory (CD-ROM), compact disk-read/write (CD-R/W) and DVD.

A data processing system suitable for storing and/or executing program code will include at least one processor coupled directly or indirectly to memory elements through a system bus. The memory elements can include local memory employed during actual execution of the program code, bulk storage, and cache memories, which provide temporary storage of at least some program code in order to reduce the number of times code must be retrieved from bulk storage during execution.

Input/output or I/O devices (including but not limited to keyboards, displays, pointing devices, etc.) can be coupled to the system either directly or through intervening I/O controllers.

Network adapters may also be coupled to the system to enable the data processing system to become coupled to other data processing systems or remote printers or storage devices through intervening private or public networks. Modems, cable modem and Ethernet cards are just a few of the currently available types of network adapters.

The description of the present invention has been presented for purposes of illustration and description, and is not intended to be exhaustive or limited to the invention in the form disclosed. Many modifications and variations will be apparent to those of ordinary skill in the art. The embodiment was chosen and described in order to best explain the principles of the invention, the practical application, and to enable others of ordinary skill in the art to understand the invention for various embodiments with various modifications as are suited to the particular use contemplated.

What is claimed is:

1. A method for identifying blockages in a heat sink, the method comprising:
   providing a heat sink, wherein the heat sink comprises a plurality of fins, and wherein each of the plurality of fins comprises an aperture within a fin body to form a plurality of apertures, and wherein the plurality of fins are arranged so that the respective apertures in each of the plurality of fins align in a collinear manner;
   directing a stream of electromagnetic radiation from an electromagnetic emitter to an electromagnetic detector such that the stream of electromagnetic radiation traverses through a path that starts with a first one of the plurality of apertures and ends with a last one of the plurality of apertures, wherein the path includes each one of the plurality of apertures, and wherein the stream is directed through each one of the plurality of apertures;
   measuring, by the electromagnetic detector, a detected intensity of the stream of electromagnetic radiation to form a measured intensity;
   generating, by the electromagnetic detector, an electrical signal, wherein a strength of the electrical signal is proportional to the measured intensity;
determining a debris blockage level of the heat sink based on the strength of the electrical signal; and
   monitoring a degradation of the strength of the electrical signal during a timed duration, wherein a rate of the degradation correlates to a rate of debris accumulation within the heat sink during the timed duration.

2. The method of claim 1, wherein the heat sink comprises a plurality of interstices, the method further comprising:
   linearly aligning a second electromagnetic emitter and a second electromagnetic detector along at least one of the plurality of interstices; and
   directing a second stream of electromagnetic radiation from the second electromagnetic emitter to the second electromagnetic detector such that the second stream of electromagnetic radiation traverses through at least one of plurality of interstices.

3. The method of claim 1 wherein the electromagnetic emitter is selected from the group consisting of a light bulb, a heating element, a light emitting diode, a laser, a vertical-cavity surface-emitting laser, a vertical external-cavity surface-emitting lasers, and an edge emitting diode.

4. The method of claim 1, wherein the alert is selected from the group consisting of an audible alarm, a visual alarm, an e-mail, and a text message.

5. The method of claim 1, further comprising:
   responsive to determining the debris blockage level of the heat sink, identifying whether the debris blockage level of the heat sink is above a blockage threshold; and
   responsive to identifying that the debris blockage level of the heat sink is above the blockage threshold, generating an alert.

6. An apparatus comprising:
   a heat sink comprising a plurality of fins, and wherein each of the plurality of fins comprises an aperture within a fin body, and wherein the plurality of fins are arranged so that the respective apertures in each of the plurality of fins align in a collinear manner;
   an electromagnetic emitter positioned on a first side of the heat sink, wherein the electromagnetic emitter emits a stream of electromagnetic radiation at an emitted intensity such that the stream of electromagnetic radiation traverses through a path that starts with a first one of the plurality of apertures and ends with a last one of the plurality of apertures, wherein the path includes each one of the plurality of apertures, and wherein the stream is directed through each one of the plurality of apertures;
   an electromagnetic detector positioned on a second side of the heat sink, wherein the second side is substantially opposite of the first side of the heat sink and wherein the electromagnetic detector measures a detected intensity of the stream of electromagnetic radiation to form a measured intensity and generates an electrical signal, wherein a strength of the electrical signal is proportional to the measured intensity;
   and
   a processor unit coupled to the electromagnetic detector, wherein the processor unit determines a debris blockage level of the heat sink based on the strength of the electrical signal; and monitors a degradation of the strength of the electrical signal during a timed duration, wherein a rate of the degradation correlates to a rate of debris accumulation within the heat sink during the timed duration.

7. The apparatus of claim 6, wherein the processor unit is coupled to the electromagnetic detector through a bus.

8. The apparatus of claim 6, further comprising:
   a second electromagnetic emitter and a second electromagnetic detector that are linearly aligning along at least one of the plurality of interstices; and
   wherein a second stream of electromagnetic radiation is directed from the second electromagnetic emitter to the second electromagnetic detector such that the second stream of electromagnetic radiation traverses through at least one of plurality of interstices.

9. The apparatus of claim 6, wherein the electromagnetic emitter is selected from the group consisting of a light bulb, a heating element, a light emitting diode, a laser, a vertical-cavity surface-emitting laser, a vertical external-cavity surface-emitting lasers, and an edge emitting diode.

10. The apparatus of claim 6, wherein the alert is selected from the group consisting of an audible alarm, a visual alarm, an e-mail, and a text message.

11. The apparatus of claim 6, wherein an alert is generated responsive to identifying that the debris blockage level of the heat sink is above the blockage threshold.

* * * * *